United States Patent [19]
Himeno et al.

[11] Patent Number: 5,434,449
[45] Date of Patent: Jul. 18, 1995

[54] SEMICONDUCTOR DEVICE IN A SINGLE PACKAGE WITH HIGH WIRING DENSITY AND A HEAT SINK

[75] Inventors: Daichi Himeno, Kawanishi; Hazime Kato, Itami, both of Japan

[73] Assignee: Mitsubishi Denki Kabushiki Kaisha, Tokyo, Japan

[21] Appl. No.: 285,779

[22] Filed: Aug. 4, 1994

Related U.S. Application Data

[63] Continuation of Ser. No. 950,588, Sep. 25, 1992, abandoned.

[30] Foreign Application Priority Data

Feb. 6, 1992 [JP] Japan ................................. 4-020907

[51] Int. Cl.$^6$ ...................... H01L 23/31; H01L 23/34; H01L 23/48
[52] U.S. Cl. ..................................... 257/690; 257/706; 257/713; 257/796
[58] Field of Search ............... 257/675, 666, 584, 688, 257/689, 698, 706, 717, 707, 712, 713, 676, 787, 796, 791, 788, 587, 690, 718, 731

[56] References Cited

U.S. PATENT DOCUMENTS

| | | | |
|---|---|---|---|
| 3,753,056 | 8/1973 | Cooke | 257/675 |
| 4,067,041 | 1/1978 | Hutson | 257/675 |
| 4,352,120 | 9/1982 | Kurihara et al. | 257/717 |
| 4,951,120 | 8/1990 | Hagiwara et al. | 257/676 |
| 5,049,973 | 9/1991 | Satriano et al. | 257/675 |
| 5,105,259 | 4/1992 | McShane et al. | 257/707 |
| 5,157,478 | 10/1992 | Ueda et al. | 257/675 |

FOREIGN PATENT DOCUMENTS

| | | | |
|---|---|---|---|
| 0178977 | 4/1986 | European Pat. Off. | 257/675 |
| 0399447 | 11/1990 | European Pat. Off. | 257/675 |
| 2488445 | 2/1982 | France | 257/712 |
| 3604075 | 8/1987 | Germany | 257/675 |
| 0101256 | 4/1991 | Japan | 257/717 |

*Primary Examiner*—William Mintel
*Assistant Examiner*—Peter Toby Brown
*Attorney, Agent, or Firm*—Oblon, Spivak, McClelland, Maier, & Neustadt

[57] ABSTRACT

There is disclosed a semiconductor device wherein an insulating layer (10) is formed on the reverse face of a lead frame (1), and a heat sink (200) is formed on the reverse face of the insulating layer (10). Transfer molding is carried out such that the reverse face of the heat sink (200) is exposed. The lead frame (1) is insulated from the heat sink (200) by the insulating layer (10). When the semiconductor device is mounted on a conductive external mounting base plate, it is unnecessary to insulate the semiconductor device from the external mounting base plate. This simplifies the process of mounting the semiconductor device on the external mounting base plate.

13 Claims, 5 Drawing Sheets

SEMICONDUCTOR DEVICE IN A SINGLE PACKAGE WITH HIGH WIRING DENSITY AND A HEAT SINK

This application is a Continuation of application Ser. No. 07/950,588, filed on Sep. 25, 1992, now abandoned.

BACKGROUND OF THE INVENTION

1. Field of the Invention

The present invention relates to a semiconductor device including a power element and a control semiconductor element for controlling the power element and a method of fabricating the semiconductor device.

2. Description of the Background Art

FIG. 8 is a cross-sectional view of a conventional multichip power semiconductor device including a power element and a control semiconductor element for controlling the power element, and FIG. 9 is a plan view of the power semiconductor device of FIG. 8. The power semiconductor device shown in FIGS. 8 and 9 will be described hereinafter with process steps for fabricating the same.

A power element 3, a control semiconductor element 2 and a passive element 8 are soldered with solder 6 in position onto a lead frame 1 which is heated. The control semiconductor element 2 controls the power element 3. The passive element 8, formed by capacitors and chip resistors, enhances the characteristics of the power semiconductor device, for example, suppresses oscillation.

The power element 3 and control semiconductor element 2 are wire bonded to the lead frame 1 with aluminum wires 5 and gold wires 4. Transfer molding is carried out by using packaging resin 7 to integrally package the power element 3, control semiconductor element 2 and passive element 8. The lead frame 1 is cut along the dashed-and-dotted line of FIGS. 8 and 9 to remove a tie bar 11. This permits the lead frame 1 to be separated into leads. A hole is previously formed in a predetermined portion of the lead on which the power element 3 is mounted. A hole 100 is formed in the packaging resin 7 in corresponding relation to the hole in the lead after the transfer molding. Thus, the threaded hole 100 is formed.

The reverse face of the power element 3 serves as a collector. The reverse face of the lead which contacts the collector is exposed to radiate heat generated by the power element 3.

After cutting off the tie bar 11, an electric signal is applied to the respective leads to inspect the power semiconductor device. Since the reverse face of the power element 3 serves as the collector as above described, the lead on which the power element 3 is mounted is at a collector potential. For insulation from the collector of the power element 3, the control semiconductor element 2 is mounted on a concave portion (not shown) referred to as an island which is provided in one of different leads from the lead on which the power element 3 is mounted.

Description will be given of a process for mounting the power semiconductor device thus fabricated on a conductive external mounting base plate 15 with reference to FIG. 10. It is necessary in this case to insulate the external mounting base plate 15 from the reverse face of the lead exposed for heat radiation. One of the insulating methods is to provide the power semiconductor device of a full-mold type. The full-mold type power semiconductor device enables complete insulation. However, since the exposed portion of the lead is also molded, the heat radiation deteriorates, resulting in restriction of the power of the power semiconductor device.

There is provided a power semiconductor device which has an uneven fin mounted on the exposed reverse face of the lead frame 1 to improve the heat radiation of the semiconductor device. For mounting the semiconductor device on the external mounting base plate 15, it is necessary to provide an insulating sheet 12 made of material that contains silicon between the power semiconductor device and external mounting base plate 15 as shown in FIG. 10.

The conventional power semiconductor device thus constructed has the following problems: firstly, the power and control semiconductor elements 3 and 2, which are mounted on different leads, are located at a distance so that it is inconvenient to put them in a single package. Another problem is that, since the respective elements are electrically connected through the tie bar 11 before the lead frame 1 is separated into the leads, the inspection of the semiconductor device cannot be performed until the tie bar 11 is cut off after packaging. The conventional power semiconductor device is also disadvantageous in that it is necessary to mount the power semiconductor device on the conductive external mounting base plate 15, troublesomely, with the insulating sheet 12 fitted therebetween. Furthermore, the lead frame 1, which is required to support the weight of parts mounted thereon until the packaging resin 7 seals the lead frame 1, must have rigidity for transfer molding. Thus the leads of the lead frame 1 cannot be made thin. This results in difficulty of increasing a wiring density between the semiconductor elements, if in plurality, mounted on the lead frame 1.

SUMMARY OF THE INVENTION

According to the present invention, a semiconductor device comprises: a heat radiating plate having a reverse face; an insulating layer formed on the heat radiating plate; a lead provided on the insulating layer; a semiconductor element provided on the lead and connected electrically to the lead; and packaging resin for covering the heat radiating plate, the insulating layer, the lead and the semiconductor element such that the reverse face of the heat radiating plate face is exposed and one end of the lead protrudes from the packaging resin.

Since the insulating layer is provided between the heat radiating plate and lead to insulate the lead from the heat radiating plate, it is unnecessary to insulate the heat radiating plate on its reverse face from an external mounting base plate when the semiconductor device is mounted on the base plate. This simplifies the process of mounting the semiconductor device on the base plate.

The present invention is also intended for a method of fabricating a semiconductor device. According to the present invention, the method comprises the steps of: providing a lead frame which has a plurality of leads; providing a semiconductor element on the surface of a predetermined lead of the leads; forming an insulating layer on the reverse face of the predetermined lead; forming a heat radiating plate on the reverse face of the insulating layer; and covering the lead frame, the semiconductor element, the insulating layer and the heat radiating plate with packaging resin such that the heat radiating plate on its reverse face is exposed and one end of each lead in the lead frame protrudes from the packaging resin.

Since the method comprises the step of forming the insulating layer on the reverse face of the predetermined lead to insulate the predetermined lead from the heat radiating plate, it is unnecessary to insulate the heat radiating plate on its reverse face from the external mounting base plate when the semiconductor device is mounted on the base plate. This simplifies the process of mounting the semiconductor device on the base plate.

In another aspect of the present invention, the method comprises the steps of: providing a heat radiating plate; forming an insulating layer on the heat radiating plate; providing a lead frame on the insulating layer, the lead frame having a plurality of leads; providing a semiconductor element on a predetermined lead of the leads; and covering the lead frame, the semiconductor element, the insulating layer and the heat radiating plate with packaging resin such that the heat radiating plate on its reverse face is exposed and one end of each lead in the lead frame protrudes from the packaging resin.

Since the method comprises the step of forming the insulating layer on the heat radiating plate to insulate the predetermined lead in the lead frame from the heat radiating plate, it is unnecessary to insulate the heat radiating plate on its reverse face from the external mounting base plate when the semiconductor device is mounted on the base plate. This also simplifies the process of mounting the semiconductor device on the base plate.

In another aspect of the present invention, the semiconductor device comprises: a heat radiating plate having a reverse face; an insulating layer formed on the heat radiating plate; a metal foil pattern formed on the insulating layer; a semiconductor element provided on the metal foil pattern; a lead bonded to the metal foil pattern; and packaging resin for integral resin molding of the heat radiating plate, the insulating layer, the metal foil pattern, the semiconductor element and the lead such that one end of the lead protrudes from the packaging resin.

Since the insulating layer is provided on the heat radiating plate, it is unnecessary to insulate the heat radiating plate on its reverse face from the external mounting base plate when the semiconductor device is mounted on the base plate. This simplifies the process of mounting the semiconductor device on the base plate. The type of mold may be either a semi-mold type or a full-mold type. The semiconductor elements, if in plurality, are arranged in close proximity because the semiconductor elements are provided on the metal foil pattern formed on the insulating layer. This enables the semiconductor elements to be put in a signal package with ease, and increases a wiring density therebetween. The leads, if in plurality, are individually fixed when they are not integrally molded with resin because the leads are bonded to the metal foil pattern. This enables a test for continuity of the semiconductor device by applying an electric signal to the leads before the integral resin molding.

In still another aspect of the present invention, the method comprises the steps of: providing a heat radiating plate; forming an insulating layer on the heat radiating plate; forming a metal foil pattern on the insulating layer; providing a semiconductor element on the metal foil pattern; bonding individually separated leads to the metal foil pattern; and integrally molding with resin the heat radiating plate, the insulating layer, the metal foil pattern, the semiconductor element and the leads such that respective one end of the leads protrudes from the resin.

Since the method comprises the step of forming the insulating layer on the heat radiating plate, it is unnecessary to insulate the heat radiating plate on its reverse face from the external mounting base plate when the semiconductor device is mounted on the base plate. This simplifies the process of mounting the semiconductor device on the base plate. The type of mold may be either the semi-mold type or full-mold type. Since the method comprises the step of providing the semiconductor element on the metal foil pattern formed on the insulating layer, it is unnecessary to provide the semiconductor element on the lead frame. The semiconductor elements, if in plurality, are arranged in close proximity. This enables the semiconductor elements to be put in a signal package with ease, and increases the wiring density therebetween. The method further comprises the step of bonding the individually separated leads to the metal foil pattern, so that the leads are fixed if they are not integrally molded with resin. This enables the test for continuity of the semiconductor device by applying the electric signal to the leads before the integral resin molding.

A primary object of the present invention is to provide a semiconductor device which is formed in a single package with ease and a method of fabricating the same. Another object of the present invention is to provide a semiconductor device the continuity of which is tested before packaging and a method of fabricating the same. Still another object of the present invention is to provide a semiconductor device which is easily mounted on an external mounting base plate and a method of fabricating the same. A further object of the present invention is to provide a semiconductor device which has a high wiring density between semiconductor elements and a method of fabricating the same.

These and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
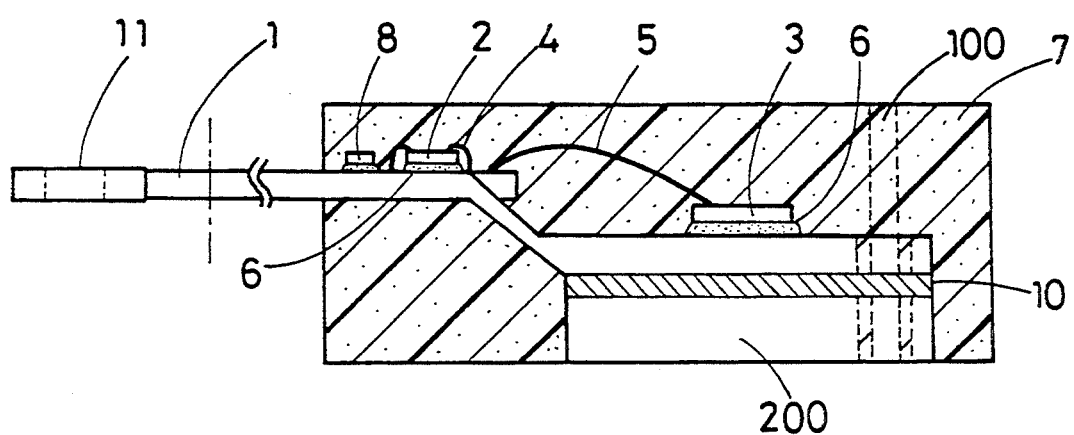
FIG. 1 is a cross-sectional view of a semiconductor device according to a first preferred embodiment of the present invention.
Figure 2:
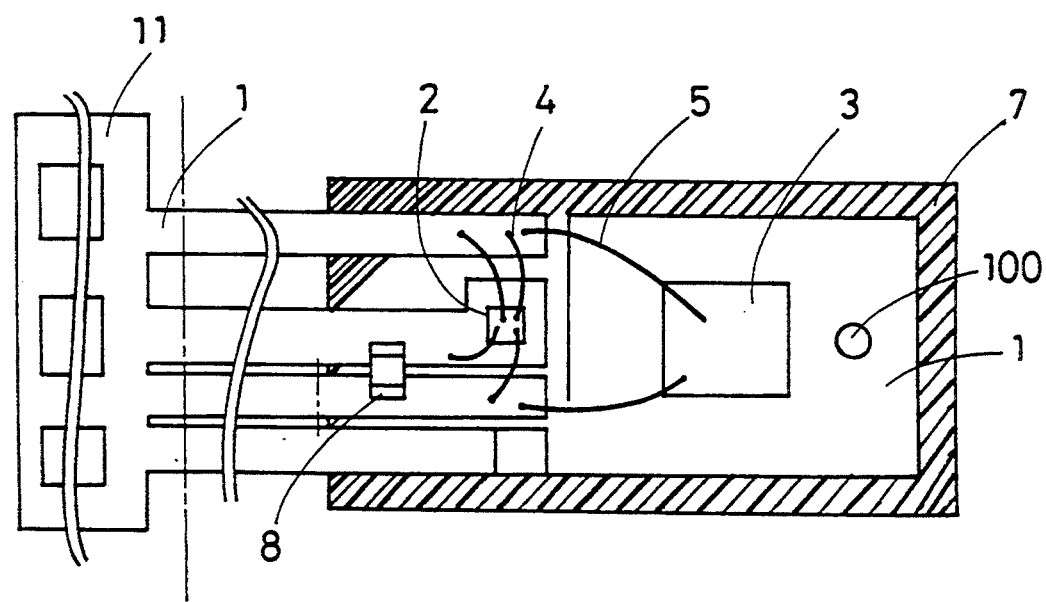
FIG. 2 is a plan view of the device of FIG. 1.

FIG. 1 is a cross-sectional view of a semiconductor device according to a first preferred embodiment of the present invention, and FIG. 2 is a plan view of the device of FIG. 1. The device of FIGS. 1 and 2 is different from the conventional device of FIGS. 8 and 9 in that the device of FIGS. 1 and 2 comprises an insulating layer 10 and a heat sink 200. The insulating layer 10 is formed on a portion of the reverse face of a lead frame 1 to be connected to a power element 3. The heat sink 200 is formed on the reverse face of the insulating layer 10, the reverse face of the heat sink 200 being exposed. The insulating layer 10 insulates the lead frame 1 from the heat sink 200. The heat sink 200, which is made of metal having excellent thermal conductivity such as aluminum, serves as a heat radiating plate for outwardly radiating the heat transferred from the power element 3 through the lead frame 1 and insulating layer 10. The other construction of the device of the first preferred embodiment is similar to that of the conventional device.

A method of fabricating the power semiconductor device of FIGS. 1 and 2 will be described hereinafter. Similarly to the method of the background art, the power element 3, a control semiconductor element 2 and a passive element 8 are soldered in position to the lead frame 1, and the elements are wire bonded to the lead frame 1 with gold wires 4 and aluminum wires 5.

An insulating sheet made of an insulating material using silicon as its main material is affixed to the face of the lead frame 1 which is reverse to the face on which the power element 3 is mounted, to form the insulating layer 10. The heat sink 200 is affixed to the reverse face of the insulating layer 10. After packaging with packaging resin 7 in the similar manner as the background art, a threaded hole 100 is formed in the packaging resin 7 and a tie bar 11 is cut off. The reverse face of the heat sink 200 is exposed at this time.

Figure 3:
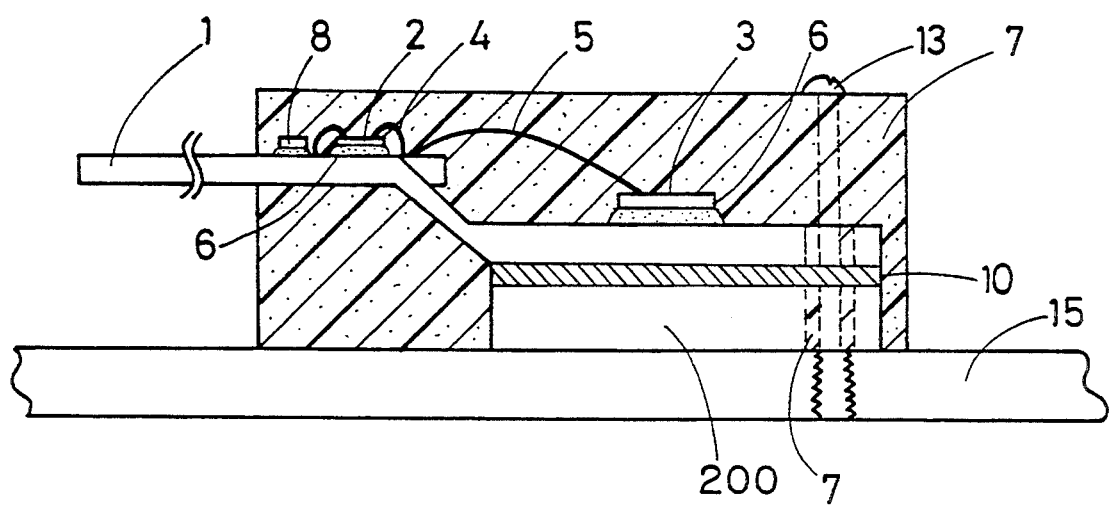
FIG. 3 is a cross-sectional view of the device of FIG. 1 when mounted on an external mounting base plate.
Figure 10:
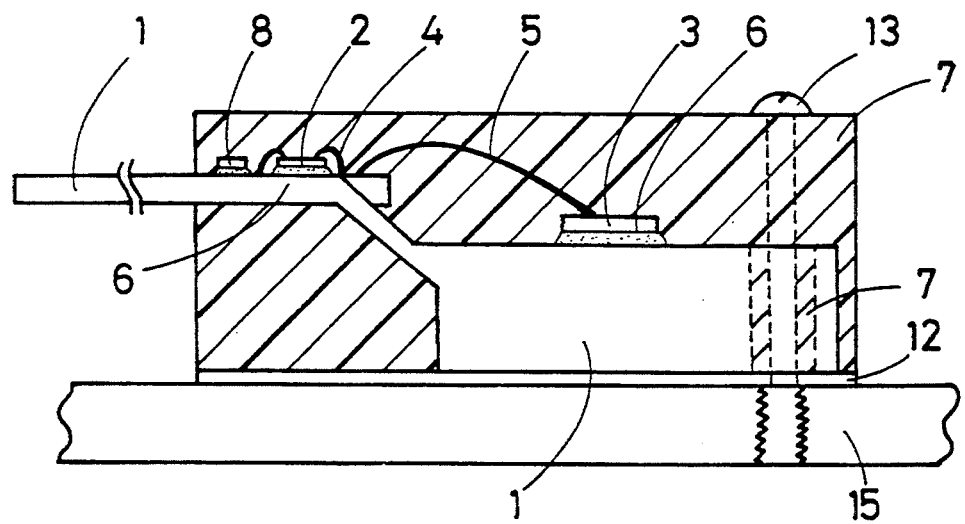
FIG. 10 is a cross-sectional view of the device of FIG. 8 when mounted on the external mounting base plate.

Description will now be given of a process for mounting the power semiconductor device thus fabricated on a conductive external mounting base plate 15 with reference to FIG. 3. The power semiconductor device is mounted on the base plate 15 with a screw 13 similarly to the backgound art, however, without the insulating sheet 12 of FIG. 10 between the power semiconductor device and base plate 15. This is because the heat sink 200 which contacts the base plate 15 is insulated by the insulating layer 10 from a lead which contacts the collector of the power element 3. Since it is unnecessary to provide the insulating sheet between the power semiconductor device and base plate 15 for joining them together as shown in FIG. 3, the mounting process is simplified.

Although the insulating layer 10 is the insulating sheet made of material that contains silicon in the first preferred embodiment, the insulating layer 10 may be made of epoxy resin that contains alumina, silica and the like, so-called high-charging epoxy resin. A method of fabricating the semiconductor device by using the epoxy resin is described below. The epoxy resin is applied by printing to the surface of the heat sink 200. The lead frame 1 is placed on the epoxy resin, and both are integrally transfer molded. The insulating layer 10 which is formed by printing the epoxy resin is thinner than the insulating layer 10 which is formed by affixing the insulating sheet. As a result, heat radiation is improved compared with the case wherein the insulating layer 10 is the insulating sheet.

Figure 4:
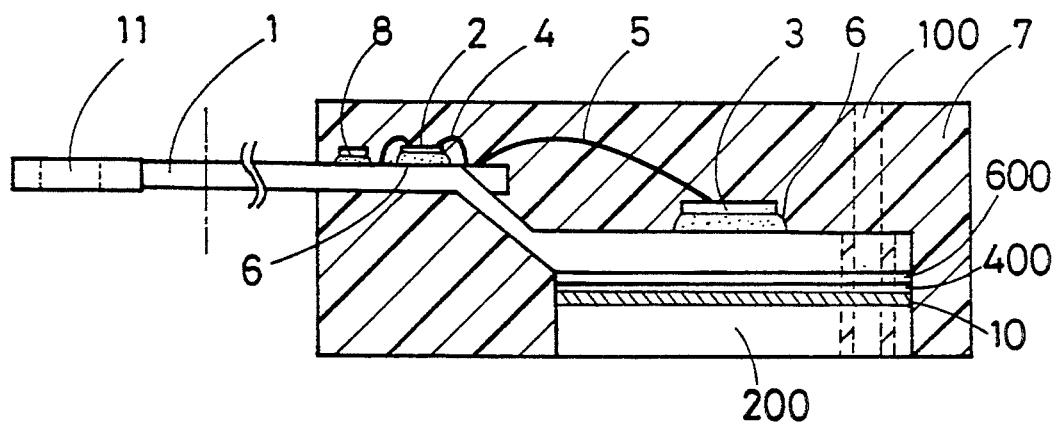
FIG. 4 is a cross-sectional view of the semiconductor device according to a second preferred embodiment of the present invention.

FIG. 4 is a cross-sectional view of the semiconductor device according to a second preferred embodiment of the present invention. The device of FIG. 4 further comprises copper foil 400 and solder 600 in addition to the device of FIG. 1. The copper foil 400 is applied by printing to the surface of the insulating layer 10. The copper foil 400 is joined to the lead frame 1 with the solder 600. The other construction of the device of FIG. 4 is similar to that of the device of FIG. 1. The copper foil 400, which is formed on the insulating layer 10 by printing, has strong adhesion to the insulating layer 10. The copper foil 400 also has strong adhesion to the solder 600 because the copper foil 400 and solder 600 are both metal. Hence the device of FIG. 4 provides stronger adhesion between the insulating layer 10 and lead frame 1 than the device of FIG. 1.

Figure 5:
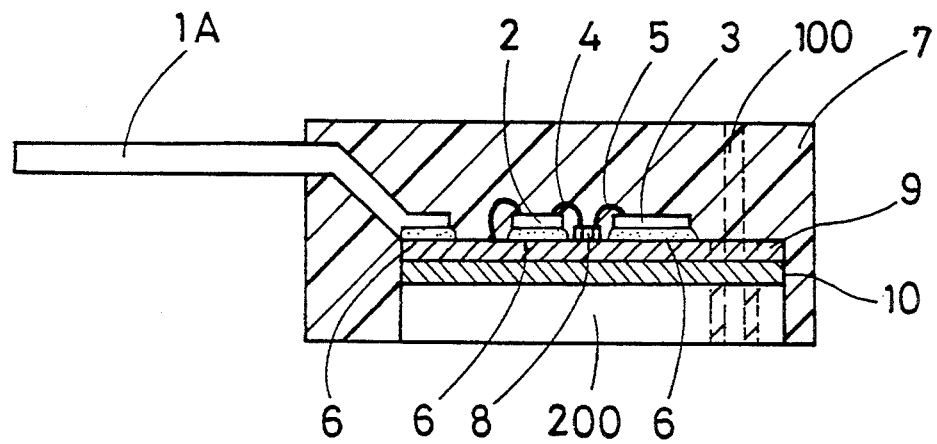
FIG. 5 is a cross-sectional view of the semiconductor device according to a third preferred embodiment of the present invention.
Figure 6:
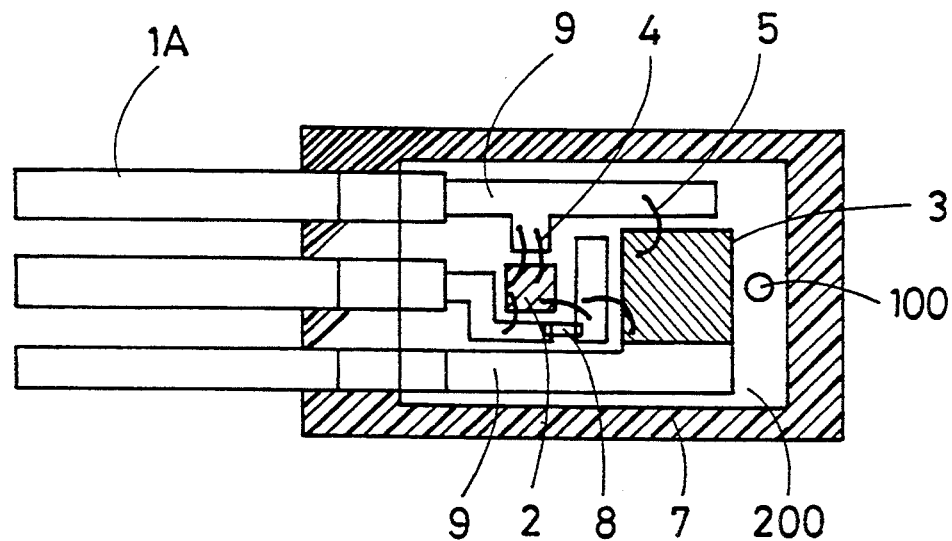
FIG. 6 is a plan view of the device of FIG. 5.

FIG. 5 is a cross-sectional view of the semiconductor device according to a third preferred embodiment of the present invention, and FIG. 6 is a plan view of the device of FIG. 5. The method of fabricating the device will be described hereinafter with reference to FIGS. 5 and 6.

The insulating sheet and the like made of material that contains silicon is affixed to the surface of the heat sink 200, to form the insulating layer 10. A copper foil pattern 9 is applied by printing to the surface of the insulating layer 10. The power element 3, control semiconductor element 2 and passive element 8 are mounted by soldering in position on the copper foil pattern 9 formed on the insulating layer 10. Leads 1A are soldered and fixedly bonded to the copper foil pattern 9. The respective elements are wire bonded to the copper foil pattern 9 with the gold wires 4 and aluminum wires 5. Wiring between the elements by using the copper foil pattern 9 formed on the insulating layer 10 has a higher density than wiring therebetween through the leads shown in FIG. 1.

After the packaging with the packaging resin 7 in the similar manner as the background art, the threaded hole 100 is formed in the packaging resin 7. The reverse face of the heat sink 200 is exposed during the packaging.

Figure 7:
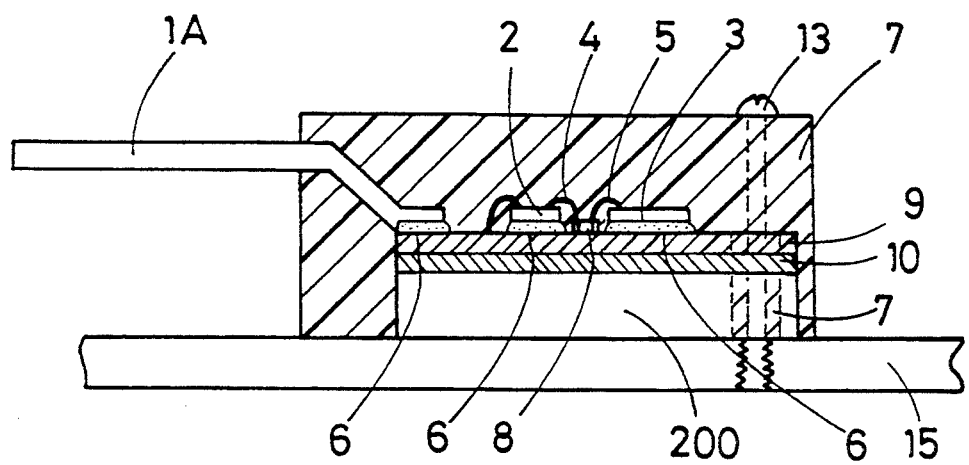
FIG. 7 is a cross-sectional view of the device of FIG. 5 when mounted on the external mounting base plate.

Description will now be given of the process for mounting the power semiconductor device thus fabricated on the conductive external mounting base plate 15 with reference to FIG. 7. The power semiconductor device is mounted on the base plate 15 with the screw 13, however, without the insulating sheet 12 of FIG. 10 between the power semiconductor device and base plate 15. This is because the heat sink 200 which contacts the base plate 15 is insulated from the copper foil pattern 9 by the insulating layer 10. This simplifies the process for mounting the power semiconductor device on the base plate 15.

Since the elements are formed on the copper foil pattern 9 and are wire bonded to the copper foil pattern 9, the elements are arranged in close proximity and are easily put in a single package.

Figure 8:
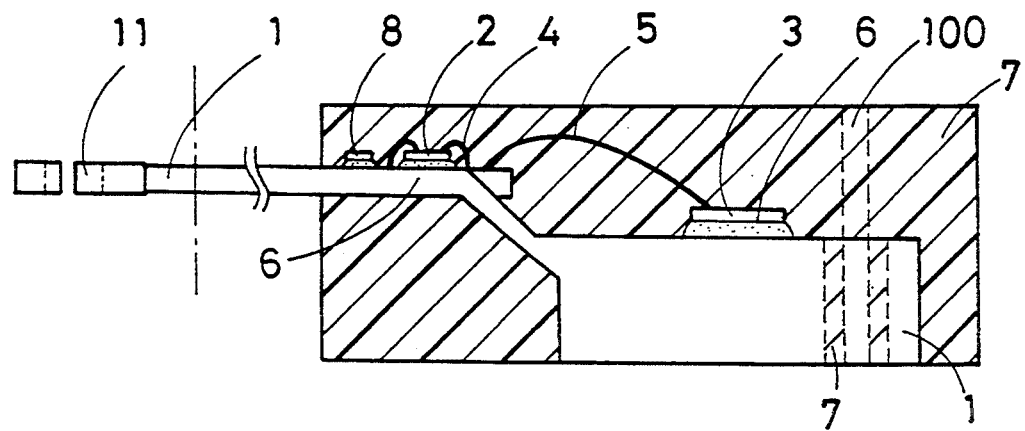
FIG. 8 is a cross-sectional view of a conventional power semiconductor device.
Figure 9:
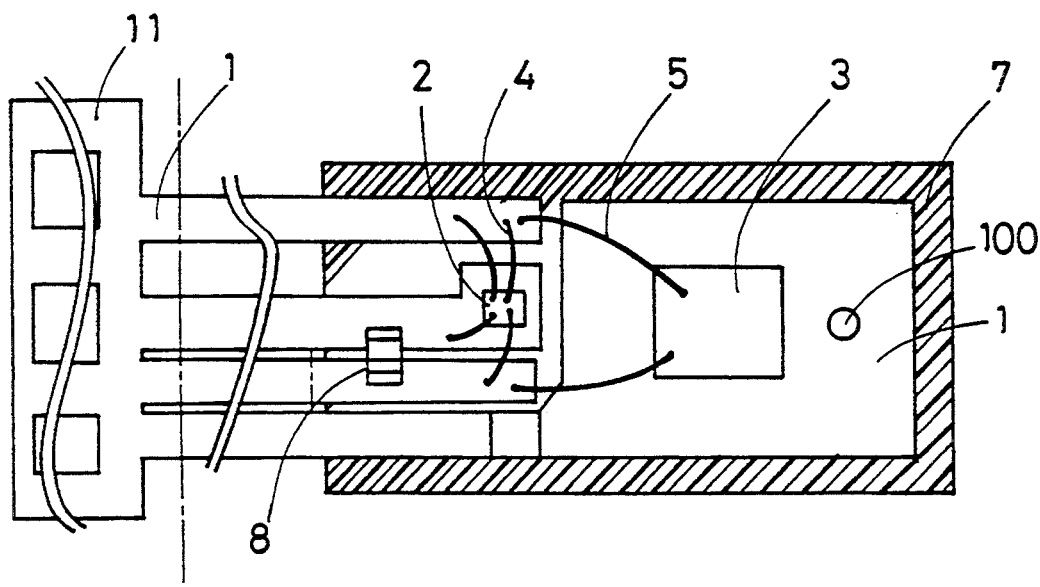
FIG. 9 is a plan view of the device of FIG. 8.

In addition, since the leads 1A are separately soldered to the copper foil pattern 9, the position of the leads 1A is fixed at the time when they are soldered. The demands of the tie bar 11 of FIG. 8 are eliminated. This enables a test for continuity of the device before the integral resin molding with the packaging resin 7.

In the third preferred embodiment, the reverse face of the heat sink 200 is exposed. However, when the elements arranged on the copper foil pattern 9 generate a small amount of heat, the reverse face of the heat sink 200 need not be exposed. The integral resin molding is achieved either by a full-mold type in which the reverse face of the heat sink 200 is sealed with resin or by a semi-mold type in which the reverse face of the heat sink 200 is exposed.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device comprising:
   a heat radiating plate having a reverse face;
   an insulating layer formed on said heat radiating plate to cover an entire surface of the heat radiating plate;
   a lead provided above said insulating layer;
   a semiconductor element provided on said lead and connected electrically to said lead;
   packaging resin for covering said heat radiating plate, said insulating layer, said lead and said semiconductor element such that only the reverse face of said heat radiating plate is exposed and one end of said lead protrudes from said packaging resin; and
   a conductive external mounting plate on which the reverse face of said heat radiating plate is mounted.

2. The semiconductor device of claim 1, wherein said insulating layer is made of an insulating material with silicon as its main material.

3. The semiconductor device of claim 1, wherein said insulating layer is made of epoxy resin.

4. The semiconductor device of claim 1, further comprising a bonding wire for electrically connecting said semiconductor element to said lead.

5. The semiconductor device of claim 4, wherein said bonding wife is an aluminum wire.

6. The semiconductor device of claim 4, wherein said bonding wire is a gold wire.

7. A semiconductor device comprising:
   a heat radiating plate having a reverse face;
   an insulating layer formed on said head radiating plate to cover an entire surface of the heat radiating plate;
   a lead provided above said insulating layer;
   a semiconductor element provided on said lead and connected electrically to said lead;
   packaging resin for covering said heat radiating plate, said insulating layer, said lead and said semiconductor element such that only the reverse face of said heat radiating plate is exposed and one end of said lead protrudes from said packaging resin; and
   a metal foil provided between said insulating layer and said lead, said metal foil being joined to said lead with solder.

8. The semiconductor device of claim 7, wherein said metal foil is copper foil.

9. A semiconductor device comprising:
   a heat radiating plate having a reverse face;
   an insulating layer formed on said heat radiating plate to cover an entire surface of the heat radiating plate;
   a metal foil pattern formed oh said insulating layer;
   a semiconductor element provided on said metal foil pattern;
   a lead bonded to said metal foil pattern;
   packaging resin for integral resin molding for said heat radiating plate, said insulating layer, said metal foil pattern, said semiconductor element and said lead such that one end of said lead protrudes from said packaging resin; and
   a conductive external mounting plate on which the reverse face of said heat radiating plate is mounted.

10. The semiconductor device of claim 9, wherein said insulating layer is made of an insulating material with silicon as its main material.

11. The semiconductor device of claim 9, wherein said metal foil pattern is a copper foil pattern.

12. The semiconductor device of claim 9, wherein said packaging resin is of a full-mold type in which all components but said one end of said lead are covered.

13. The semiconductor device of claim 9, wherein said packaging resin is of a semi-mold type in which only the reverse face of said heat radiating plate is exposed.

* * * * *